United States Patent [19]

Sutich

[11] 4,183,092
[45] Jan. 8, 1980

[54] CUBIC MAGNETIC CORE STORAGE MEMORY SYSTEM

[75] Inventor: Edward R. Sutich, St. Paul, Minn.

[73] Assignee: Fabri-Tek Incorporated, Minneapolis, Minn.

[21] Appl. No.: 929,703

[22] Filed: Jul. 31, 1978

[51] Int. Cl.$^2$ .............................................. G11C 5/06
[52] U.S. Cl. ...................................... 365/51; 365/196; 29/604
[58] Field of Search ...................... 365/51, 67, 196; 23/604, 737

[56] References Cited

U.S. PATENT DOCUMENTS

3,106,703  10/1963  Katzin .................................. 365/51

Primary Examiner—James W. Moffitt
Attorney, Agent, or Firm—Malcolm D. Reid

[57] ABSTRACT

A cubic magnetic core storage memory system which results in increased packing density of the core elements and more economical construction. Memory cores are bonded flat to carrier planes. The carrier planes are then stacked, forming a three dimensional array which is wired with X, Y and sense/inhibit lines. A parallel group (word) of binary digits is geometrically defined by a vertical line drawn through memory cores on the common intersection between an X and a Y coordinate wire on the successive carrier planes of the three dimensional array.

5 Claims, 15 Drawing Figures

Fig. 11
Y COORDINATE WIRING CONCEPT

Fig. 12
X COORDINATE WIRING CONCEPT

Fig 13
SIZING DETAIL
(256 × 9 SHOWN - THIS BLOCK DRAWN TO ILLUSTRATE WIRING CONCEPT ONLY. ACTUAL 256 × 9 BLOCK IS ORGANIZED AS 16 × 16 × 9.)

| ELECTRICAL SIZE | | DIMENSIONS | | |
|---|---|---|---|---|
| WORDS | BITS | A | B | C |
| 256 | × 9 | 8 | 32 | 9 |
| 1024 | × 18 | 32 | 32 | 18 |
| 1024 | × 20 | 32 | 32 | 20 |
| 2048 | × 18 | 32 | 64 | 18 |
| 2048 | × 20 | 64 | 64 | 20 |
| 4096 | × 18 | 64 | 64 | 18 |
| 4096 | × 20 | 64 | 64 | 20 |
| 8192 | × 18 | 64 | 128 | 18 |
| 8192 | × 20 | 64 | 128 | 20 |
| 16384 | × 18 | 128 | 128 | 18 |
| 16384 | × 20 | 128 | 128 | 20 |

Fig 14
SIZING TABLE

CUBIC MAGNETIC CORE STORAGE MEMORY SYSTEM

BACKGROUND OF THE INVENTION

1. Field of the Invention

This invention relates generally to magnetic core storage memory systems and more particularly to a magnetic core storage memory system wherein the memory cores are bonded flat to specially designed carrier planes. These carrier planes are then stacked, forming a three dimensional array which is wired with X and Y drive lines and with either a combined sense/inhibit line or separate sense and inhibit lines.

2. Description of Prior Art

The rectangular hysteresis loop properties of magnetic cores are widely known and employed for fabricating binary storage devices. A basic core storage device consists of a matrix of toroidal cores arranged in rows and columns. All cores in a given row are wired by a common conductor to provide a single turn winding through each core. Similarly, all cores in a given column are wired by a common conductor. The two sets of conductors are referred to as the X and Y drive lines.

To store a binary 1 in a selected core of a typical storage device, the X and Y drive lines which coincide at the selected core are each energized with a current of half the magnitude necessary to set the core to the one state. All of the other cores common to the energized X and Y drive lines are disturbed but not set to the one state since each is subjected to a magnetomotive force of half the value necessary to set it to the one state.

To read the binary digit stored in a selected core, the X and Y drive lines which coincide at the selected core are each energized with half the current required to change the state of the selected core but in a direction opposite to that for storing a binary digit 1. If the selected core is storing a binary digit 0, it is not disturbed by the coincident currents. However, if a binary digit 1 is stored in the selected core, the state of the core is shifted from one stable state to its other stable state. The change is then sensed by a third line commonly referred to as a sense line.

A single matrix of magnetic cores may be employed to store or read only one binary digit at a time since only one set of X and Y drive lines may be energized at the same time. Accordingly, to provide a magnetic core storage device capable of handling groups of binary digits simultaneously or in parallel, a plurality of such magnetic core matrices often called core planes must be provided, one for each binary digit of a group to be stored or read out simultaneously or in parallel. Such a group is hereby defined to be a word of memory.

In such a three-dimensional arrangement for parallel storing and reading a group of binary digits, the corresponding X and Y drive lines of each core plane are connected in series and to corresponding X and Y current drivers. The separate sense line provided in each plane senses the magnetic flux in its plane of the selected core as it is shifted from one state to the other upon reading out a binary digit 1 stored therein.

To store a group of digits in the same memory location or group of cores, one in each plane, currents are passed through the X and Y drive lines in directions opposite the current directions for reading. However, the coincident currents through the corresponding cores of each plane in the three-dimensional array would switch all cores to the one state. To inhibit the storage of a binary digit 1 in the cores of selected planes, an inhibit winding is provided in each plane through which current is selectively driven in a direction opposite to either one of the coincident currents in the X and Y lines.

The method of packaging the memory described is commonly referred to as the stacked array. This method has been largely supplanted by the planar array and the folded planar array. The planar array and the folded planar array are arranged so that each core plane is capable of handling groups of binary digits simultaneously or in parallel. To describe its arrangement in other terms, the core plane is designed to contain complete sets of words; the words being composed of bits, with a bit being defined as a single core. The planar array or folded planar array core plane is, therefore, required to be designed with a specified word length in mind. Each time a new word length is desired a new design of core plane must be employed. If the memory capacity is to be increased, additional core planes are added.

The stacked array or the cubic approach, as it is sometimes referred to, lends itself to more economical inventory maintenance for a manufacturer of core memories by utilizing common core planes as building blocks. The manufacturer is able to design a single core plane. Each time a memory with a different word length is needed, a number of core planes equivalent to the number of bits in the specified word need be provided. However, as industry adopted the logic card approach to design of electronic products, the stacked array became obsolete. The stacked array geometry did not lend itself to the dimensional constraints of the logic card. Another reason for its obsolescence was the fact that the geometry of the planar and folded planar arrays resulted in a more efficient stringing or wiring process. More cores can be wired in a planar array with each pass of the needle used in the stringing operation than with a stacked array. Since stringing is one of the most costly aspects of core memory fabrication, industry was clearly predisposed towards the planar array, notwithstanding the dimensional constraints established by the logic card approach to packaging electronic products.

Increased densities were achieved with the planar array by manipulating the core angle relative to the drive lines. The folded planar array further increased the effective density by utilizing the volume around the core arrays.

Both the stacked array and the planar method of packaging core memories utilize cores which are placed perpendicular to the core carrier surface. These cores are arranged in their desired position by means of a core loading plate. The process of loading cores so they are perpendicular to the core carrier surface causes a high incidence of damage or stress to the cores during the core loading or transferring cycles, the result of which is a lower manufacturing yield.

The cubic magnetic core storage memory system of the present invention places cores flat to the core carrier surface, thereby reducing the damaging effects of present methods of core loading. The memory system of this invention allows increased word lengths without redesign of the core plane by simply increasing the quantity of core planes for any module or array. The present invention results in an increased effective density of memory elements over planar techniques.

Just as the logic card method of packaging electronics dictated the use of planar techniques over the use of the stacked array, the geometry of the integrated circuit modules of today are dictating a new geometry for core memory systems. The present invention is of the same geometric configuration as that of the integrated circuit module. The stacked array and the planar techniques do not lend themselves to the integrated circuit geometry, since the height of a stacked array is much greater than that of typical integrated circuit packages while the height of a planar array is much less.

The stringing of the present invention is far more economical than with any of the present memory configurations. One of the reasons for the increased economy is due to the fact that the cores are not placed at 40°–45° to the axis of the X drive line and Y drive line. Therefore, when stringing these lines the stringing needle has a larger aperture target because it will see the full inside diameter of each core. This results in fewer instances where the needle hits the core rather than the core aperture.

SUMMARY OF THE INVENTION

The present invention comprises a magnetic core storage memory system which utilizes magnetic cores bonded flat against carrier planes. The carrier planes loaded with cores defines a core plane. In the preferred embodiment, core planes are stacked so that the axis of each core in any given core plane coincides with the axis of a core in the core planes above and the core planes below. Each carrier plane has a series of aligned rows of apertures. The apertures of each carrier plane are spaced fixed distances apart. These fixed distances between apertures for any given carrier plane are the same as the fixed distances between apertures for any other carrier plane. The magnetic cores are bonded to the periphery of the apertures so that the axis of any given core coincides with the axis of its aperture.

The stack of core planes are threaded to form a magnetic core storage memory system. A wire is threaded parallel to the axis of a core from the top of the stack through the stack to the bottom of the stack. The wire is then threaded from the bottom to the top of the stack and so forth along an entire row of the stack. In the preferred embodiment this wire is either the X or the Y drive line of the memory system. This wire may, however, be utilized as the sense/inhibit line. In a similar manner another wire is threaded along an entire column of the stack. A column is defined as a series of aligned apertures at an angle to a series of aligned rows of apertures. In the preferred embodiment a column is perpendicular to a row. This other wire is either the Y or X, or sense/inhibit line of the memory system, depending upon how the first wire was defined.

A third line is threaded diagonally through the memory system so that the number of binary digits of a group of binary digits or, stated differently, the number of bits in a word of memory is defined by the number of core planes in the stack. The word of memory is geometrically represented by a vertical line through the memory system. This third line is preferably defined as the sense/inhibit line, but may also be the X or Y drive line, depending upon how the first two lines were defined.

The threaded memory system is mechanically held together by the threaded wires. The periphery of the core planes may also be mechanically bonded together to provide added rigidity.

Electrically, the memory system leads may be terminated by conventional techniques.

The system may then be hermetically sealed and potted or may be held in a suitable mechanical jig or frame and mounted appropriately for the environment in which it is to be used.

To allow ease in threading the diagonal line, second apertures which, for ease of reference, will be referred to as blivit apertures, are employed. These blivit apertures are adjacent to the first apertures and in communication with them. Their purpose is to provide a straight diagonal channel or tunnel through the stack. The diagonally disposed wire can then be threaded straight through the stack without need for time consuming weaving of the diagonally disposed wire.

DESCRIPTION OF THE PREFERRED EMBODIMENT

Figure 1:
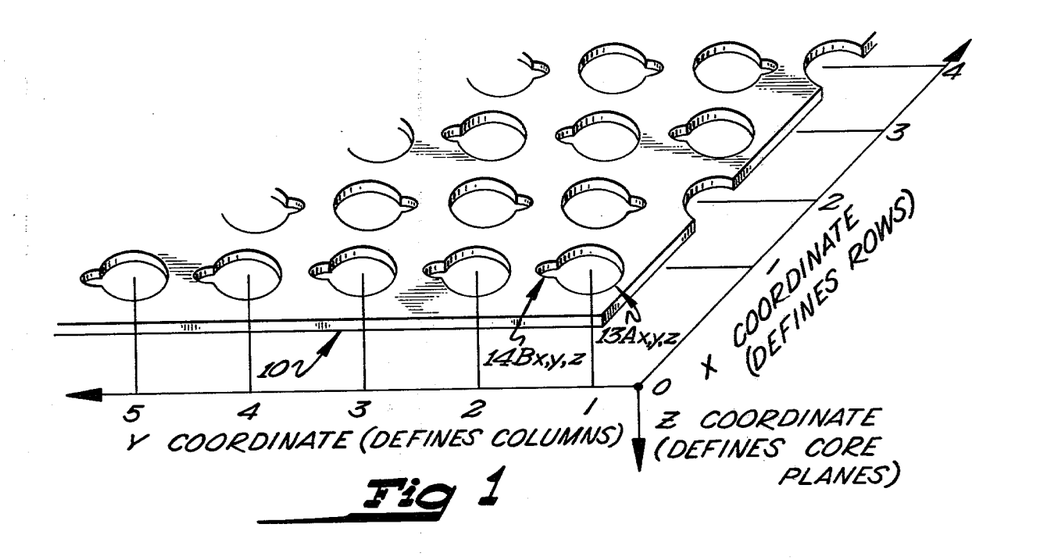
FIG. 1. Odd Core Carrier Plane
FIG. 2. Even Core Carrier Plane
FIG. 3. Odd Core Carrier Plane with Memory Cores in Place
FIG. 4. Even Core Carrier Plane with Memory Cores in Place
FIG. 5. Stacking Arrangement of Memory Planes
FIG. 6. Construction and Sense Wiring Technique
FIG. 7. Construction and X Wiring Technique
FIG. 8. Construction and Y Wiring Technique
FIG. 9. Sense/Inhibit "O" Wiring Diagram
FIG. 10. Sense/Inhibit "1" Wiring Diagram
FIG. 11. Y Coordinate Wiring Concept
FIG. 12. X Coordinate Wiring Concept
FIG. 13. Sizing Detail
FIG. 14. Sizing Table
FIG. 15. Odd Core Carrier Plane with Memory Cores in place on both sides

Referring to the figures, there is illustrated at 10, in FIG. 1, an odd carrier plane. The odd carrier plane 10 is the substrate to which toroidal magnetic cores are bonded in a flat position as illustrated at 11 in FIG. 3. Magnetic cores of the character contemplated herein are well known in the memory and magnetic switching art and exhibit substantially rectangular hysteresis characteristics.

The odd carrier plane 10 is fabricated from berylium copper with an approximate thickness of 2/1000 of an inch; although a carrier plane of any thickness would provide an operative memory system as contemplated by this invention. Thinner material, however, results in a more compact memory system. The principals of this invention are also applicable to other arrangements than that illustrated by the core plane 12 in FIG. 3. For example, cores may be bonded to applicable rows and columns on both sides of carrier plane 10.

The odd carrier plane 10 contains a plurality of apertures $13A_{x,y,z}$ in FIG. 1. These apertures $13A_{x,y,z}$ will be individually referred to with reference to an x,y,z coordinate system. FIG. 1 illustrates these coordinates. An aperture with an x coordinate of 1, a y coordinate of 2, and a z coordinate of 3 would be referred to as aperture $13A_{1,2,3}$. A generalized expression for any aperture would be $13A_{x,y,z}$. Each aperture $13A_{x,y,z}$ has adjacent to it and in communication with it a blivit aperture $14B_{x,y,z}$ in FIG. 1.

For reference purposes the x coordinate shall define rows and the y coordinate shall define columns. The z coordinate shall define core carrier planes 12.

The blivit $14B_{1,y,z}$ in row 1 in FIG. 1 is aligned in a direction opposite to the alignment of the blivit $14B_{2,y,z}$ in row 2 in FIG. 1 and the blivit $14B_{3,y,z}$ is aligned in opposition to the blivit $14B_{2,y,z}$ in row 2 in FIG. 1 and so forth throughout N rows of an odd carrier plane 10.

Figure 13:
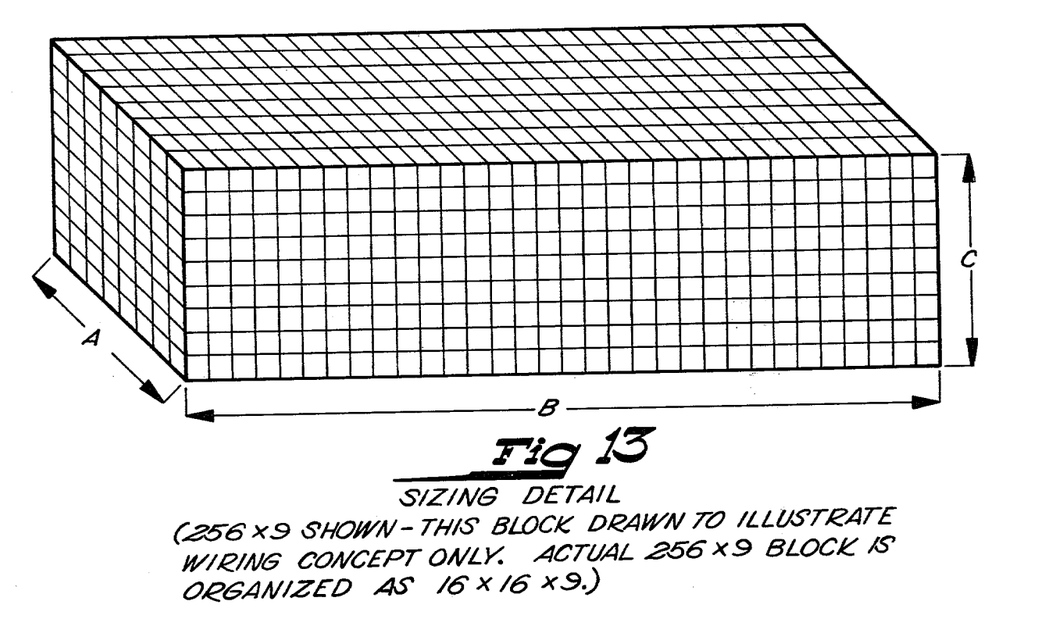
Figure 14:
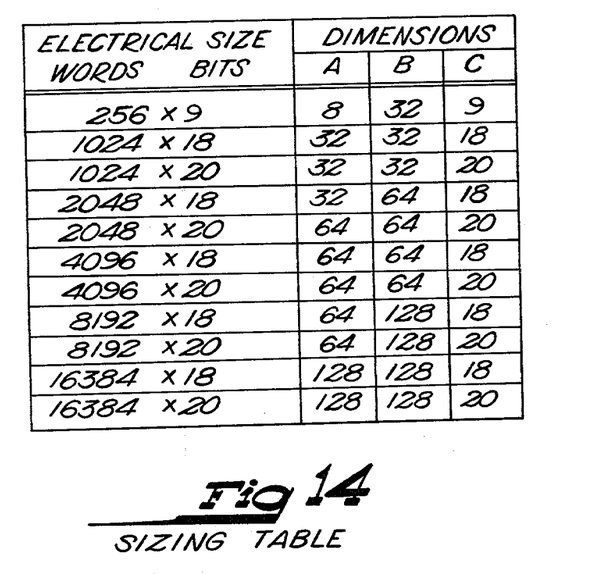

The number of rows and columns in any odd carrier plane 10 is dependent upon the number of binary digits of memory desired for each core plane 12. The product of the columns and rows of any core plane defines the number of binary digits of memory available in that core plane as illustrated in FIGS. 13 and 14.

Figure 2:
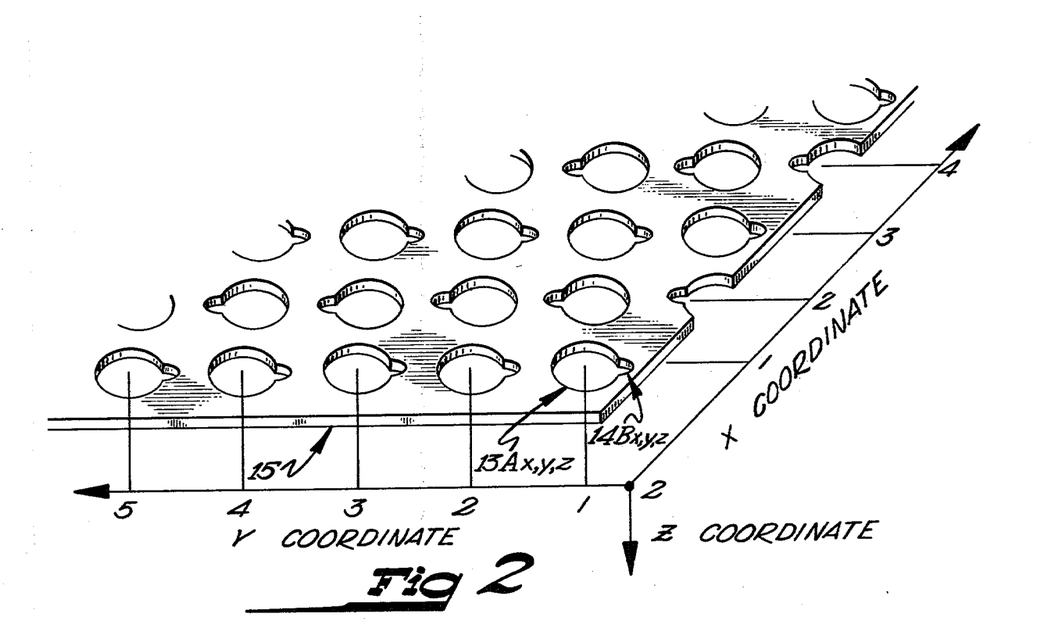

To provide a magnetic core storage device capable of handling groups of binary digits simultaneously or in parallel (words), a plurality of core planes 12 must be provided, one for each binary digit of a group or word to be stored or read out in parallel. An even carrier plane 15, in FIG. 2, is provided as a second carrier plane type in the preferred embodiment. The odd carrier planes 10 and the even carrier planes 15 are alternately stacked along the z coordinate to form an array 16, in FIG. 5.

Figure 5:
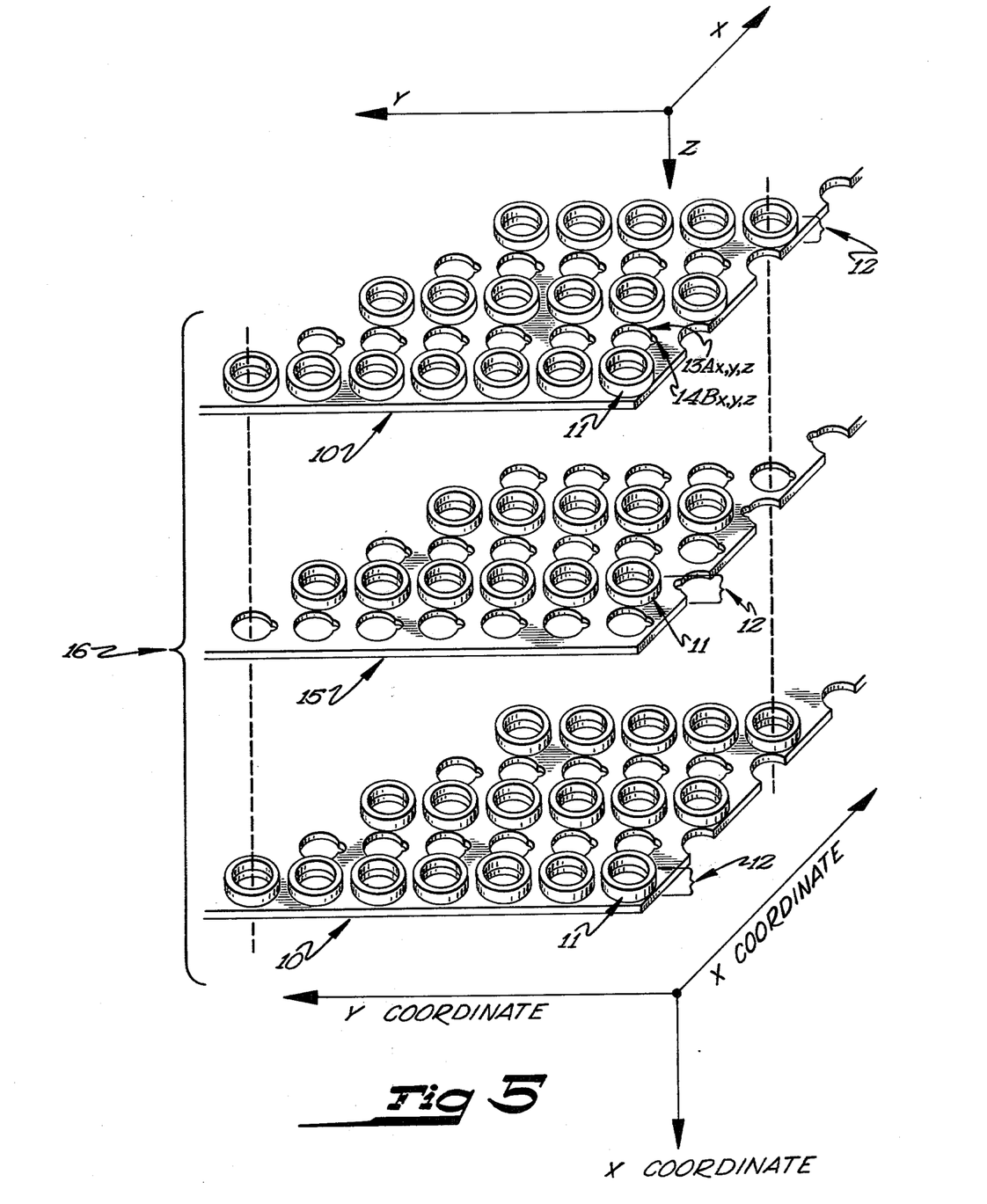

The even carrier plane 15 is identical to the odd carrier plane 10 except for the disposition of blivits $14B_{x,y,2}$ with relation to the blivits $14B_{x,y,1}$ in each of the corresponding rows of the odd carrier plane 10. The blivits $14B_{x,y,2}$ in even carrier plane 15 are in opposed relationship to the blivits $14B_{x,y,1}$ in the odd carrier plane 15 where the odd carrier plane 15 is defined as occupying position 1 on the z coordinate and the even carrier plane is defined as occupying position 2 on the z coordinate. The opposed relationship is illustrated in FIGS. 1, 2 and 5.

Figure 3:
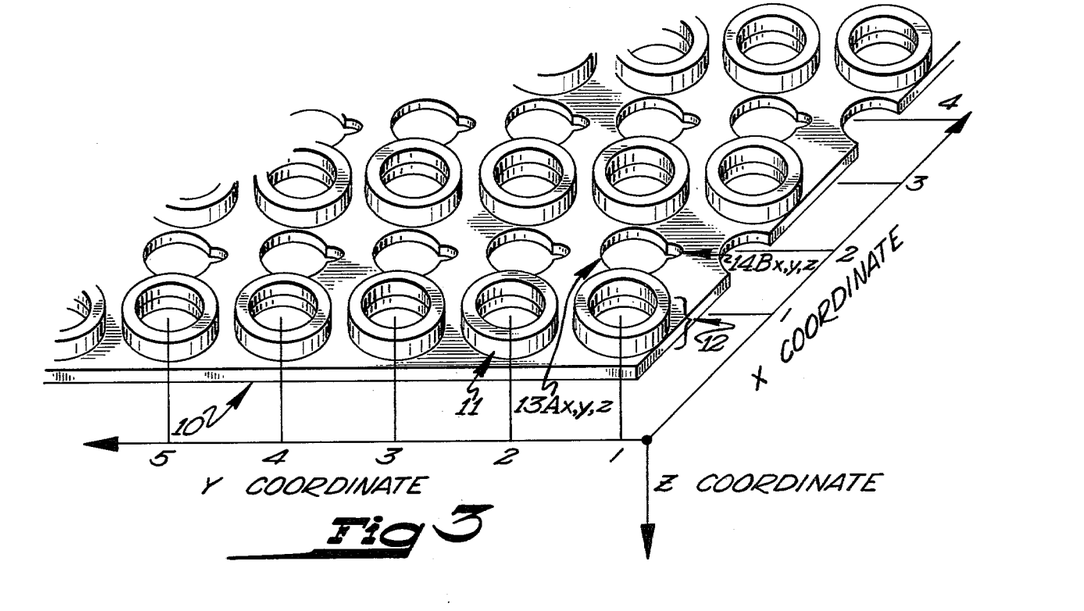

A core plane 12 is illustrated in FIG. 3. A core plane is an odd carrier plane 10 or an even carrier plane 15 loaded with toroidal memory cores 11. The cores 11 are placed over and in registry with apertures $13A_{x,y,z}$. The longitudinal axis of memory cores 11 is in alignment with and parallel to the axis of apertures $13A_{x,y,z}$.

The cores 11 are bonded to the odd carrier planes 10 and the even carrier planes 15 by any suitable means. The preferred embodiment uses an epoxy. The epoxy must be of a resilient nature to allow for the inherent expansion of the memory cores 11 upon energization of the cores 11. Such an epoxy is readily available in the commercial market.

Only every row of an odd carrier plane 10 in FIG. 3 has a memory core 11 affixed to all of the apertures $13A_{x,y,z}$. Each row that has cores 11 affixed to any aperture $13A_{x,y,z}$ has cores 11 affixed to every aperture $13A_{x,y,z}$ in that row. A row either has cores 11 affixed to all the apertures $13A_{x,y,z}$ in that row or a row does not have any cores affixed to any of the apertures $13A_{x,y,z}$.

Figure 4:
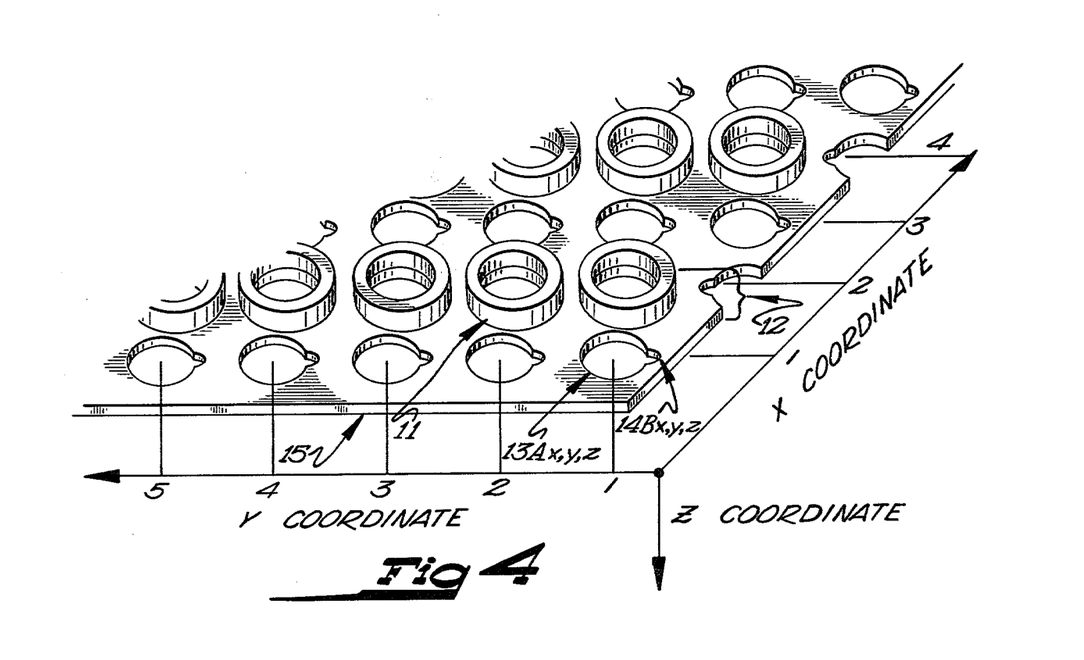

FIG. 4 illustrates the layout of the memory cores 11 on an even carrier plane 15. The layout differs from the layout of the cores 11 on an odd carrier plane 10 only in that for every row as defined by the x coordinate that has a core 11 affixed to it on an odd carrier plane 10, the corresponding row on the even carrier plane 15 does not have any memory cores 11 affixed in registry with apertures $14A_{x,y,z}$. The converse is also true that for an odd carrier plane 10, every row which has no cores affixed, the corresponding row on the even carrier plane 15 does have memory cores 11 affixed.

FIG. 5 is an exploded view of a stack of core planes 12 which forms a memory array 16. An array 16 consists of N layers of odd carrier planes 10 and even carrier planes 15 arranged so that odd carrier planes 10 and even carrier planes 15 alternate along the z coordinate throughout the stack. The stack may have as a first plane along the z coordinate either an odd carrier plane 10 or an even carrier plane 15. The only requirement in this respect is that the odd carrier planes 10 and the carrier planes 15 alternate throughout the stack.

Each core plane 12 is aligned in the array so that their respective x and y coordinates are in substantial alignment one over the other. As a result, the axis of apertures $13A_{1,1,1}$ through $13A_{n,n,1}$ substantially coincides with the axis of apertures $13A_{1,1,n}$ through $13A_{n,n,n}$, respectively.

Along a z coordinate drawn from $13A_{1,n,1}$ to $13A_{1,n,n}$ in FIG. 5, there would be encountered a core 11; an odd carrier plane 10; no core 11; an even carrier plane 15; a core 11; an odd carrier plane 10; and so forth.

Figure 6:
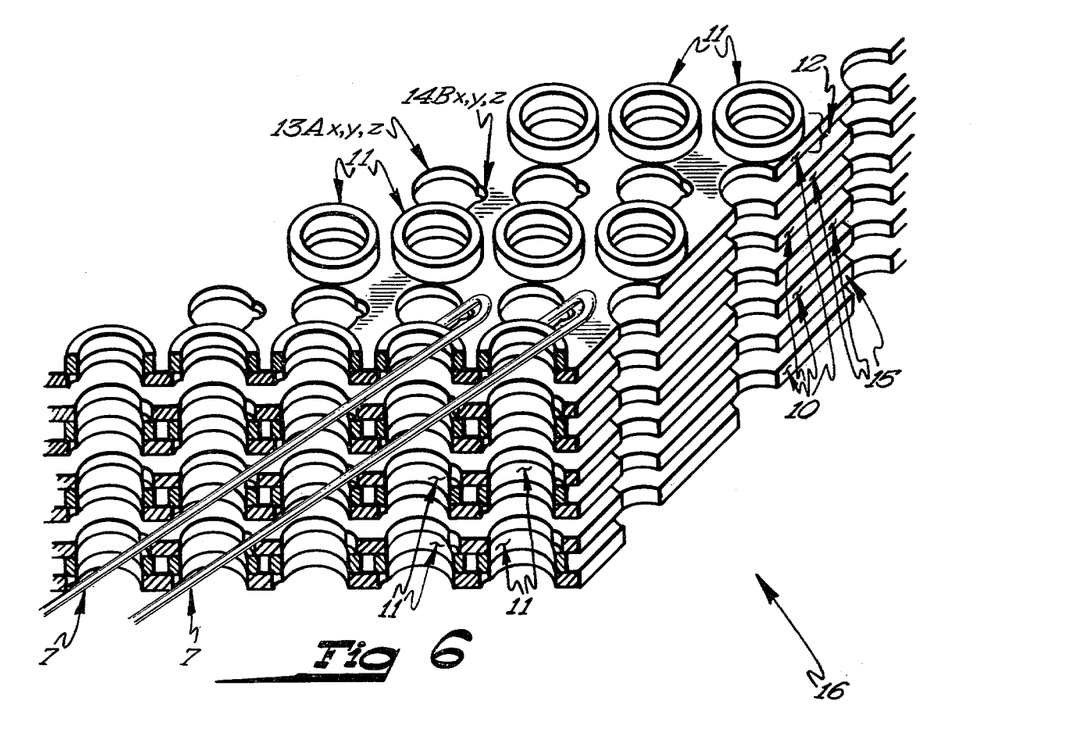
Figure 7:
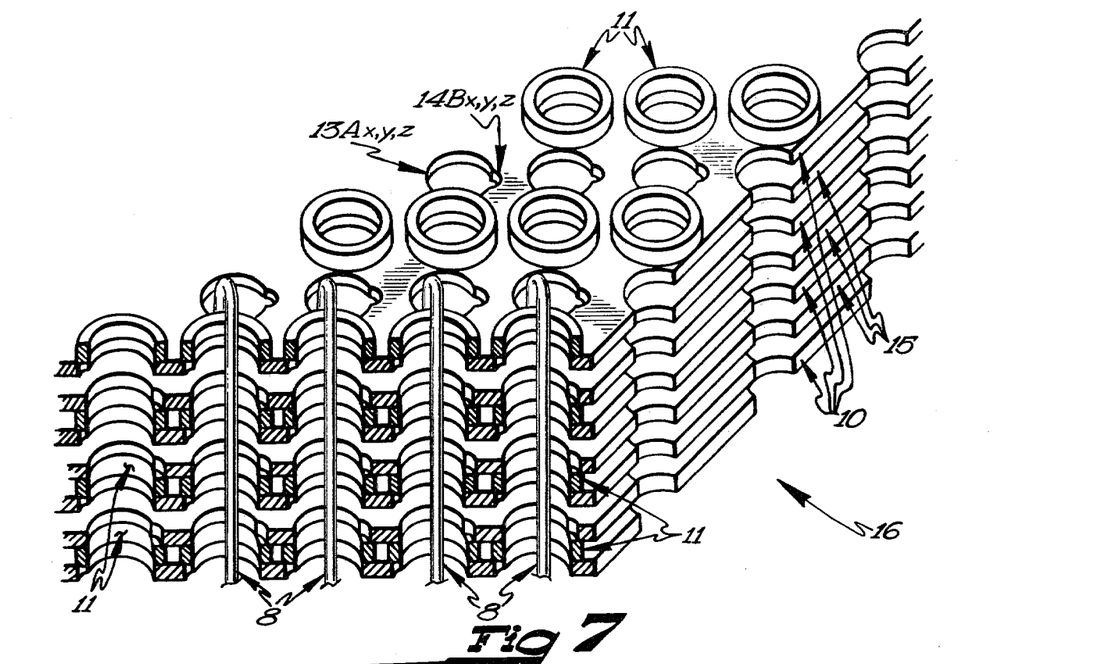
Figure 8:
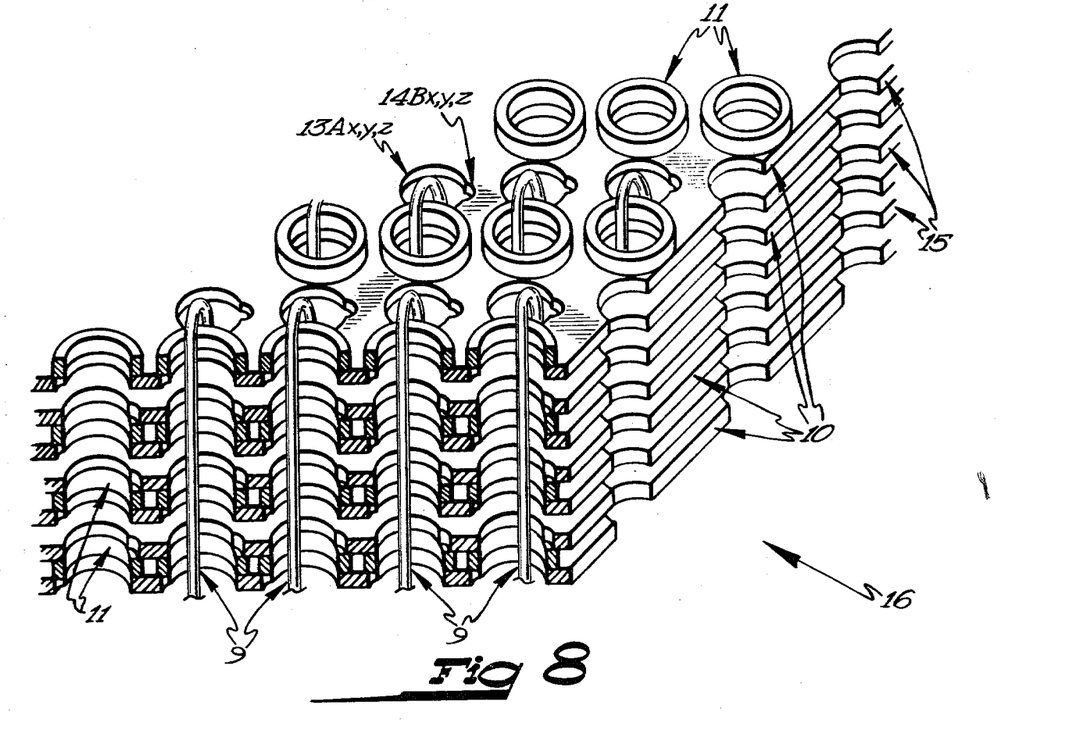

The core planes 12 are mechanically held together to form the array 16 only by the threading of the X drive line 8, the Y drive line 9 and the sense/inhibit line 7, as illustrated in FIGS. 6, 7 & 8.

Conventional core memory design utilizes cores 11 which are affixed on edge to a substrate such as the odd carrier planes 10 and the even carrier planes 15 of this invention. The cores are bonded to the substrate, usually with a silicon adhesive. Multiple layers of substrate with cores 11 affixed thereto are stacked to form an array. Each layer of the array must be mechanically linked to the other layer to form the array by a linkage method other than simply by the threaded X drive line 8, the Y drive line 9 and the sense/inhibit line 7.

It is readily apparent that conventionally designed core memory occupies a greater volume per memory core 11 than with the design of the present invention. One of the drawbacks to core memories has been the relatively large size of the core memory as compared to the semi-conductor memory. The present invention reduced the volume that a conventional stacked core memory occupies by up to 90 percent. It also uses the volume available to the planar type of memory more efficiently increasing the core density per utlized board area by up to a factor of 10.

The conventionally designed core memory which affixes the cores 11 edgewise to the substrate subjects the magnetic cores 11 to stresses which the present invention does not impose. During the manufacturing process when the cores 11 are loaded onto a substrate in an edgewise position, there is a force component exerted on the core 11 in a direction transverse to an axis through its center. The core 11 is very vulnerable to breakage from these transverse forces. The present invention does not impose these transverse forces during manufacturing. A force is exerted in a direction parallel to the core's 11 axis. The core 11 is far less vulnerable to breakage from forces exerted in this direction. The present invention, therefore, provides a product which has a higher yield during the manufacturing cycle than conventionally designed core memories.

FIG. 6 illustrates the diagonal interleaving of the sense/inhibit line 7 in the array 16. The purpose of the blivit apertures $14B_{x,y,z}$ is to allow the diagonally interleaved sense/inhibit line 7 to be threaded in a straight line. The array 16 is assembled and held in a jig during fabrication. The array 16 is then threaded with the X drive lines 8, the Y drive lines 9 and the sense/inhibit line 7. For purposes of reducing the volume of the array 16 each core plane 12 is adjacent to and contiguous with the next core plane 12 in the array 16. It would be possible to thread the lines 7, 8, 9 prior to bringing the core planes in contiguous relation to one another. With this method, lines 7, 8, 9 could be threaded in other than a straight line. The core planes 12 could then be brought into contiguous relation to one another.

The purpose of having the axis of the corresponding apertures $13A_{x,y,z}$ in various core planes 12 substantially in alignment with one another is to create ease in wiring the array 16 with the lines which pass through the array perpendicular to the array. However, if the core planes 12 are offset from one another the perpendicular lines can still be threaded through the array. The diagonal line can then be threaded in an even more efficient manner than before, since the diagonal wiring window is enlarged.

The blivit apertures $14B_{x,y,z}$ extend outward from the periphery of the aperture $13A_{x,y,z}$ a distance great enough to allow the sense/inhibit line 7 to pass through the array 16 at an angle.

The angle to the array 16 of the sense/inhibit line 7 depends upon the spacing of the apertures $13A_{x,y,z}$. The path of a sense/inhibit line 7 through the array 16 is from $13A_{1,1,1}$ to $13A_{1,2,2}$ to $13A_{1,3,3}$ to $13A_{1,n,n}$. There are many sense/inhibit lines in the array 16. The above path, however, illustrates the diagonal nature of the path which the sense/inhibit line 7 takes throughout the array 16. An illustration of the interrelationship of the blivit apertures $14B_{x,y,z}$ to the sense/inhibit line 7 and to the path of that line 7 through the array 16 is shown by following the path of a typical sense/inhibit line through an array 16. Starting at $14B_{1,1,1}$, the line 7 passes through core 11 then through aperture $13A_{1,1,1}$ at an angle so that the line 7 passes into blivit $14B_{1,1,1}$. The sense/inhibit line 7 then passes through empty space above aperture $13A_{1,2,2}$ and passes through aperture $13A_{1,2,2}$ and blivit $14B_{1,2,2}$. The line then penetrates a core 11 and enters aperture $13A_{1,3,3}$ and passes through empty space where there is no core above aperture $13A_{1,4,4}$ and so forth throughout the N layers of the array 16.

As previously mentioned, each core plane 12 of the preferred embodiment of the array 16 is stacked prior to threading the lines 7,8,9. A jig is used to hold the stack together during the threading process. Upon completion of the threading process the jig is removed and the array is a completed assembly being mechanically held together by the lines 7,8 9. The lines 7, 8, 9 may be terminated by conventional means.

The entire memory array 16 may be mounted and encased by conventional means to protect it from vibration and from exposure to the environment. One method is to hermetically seal the memory stack in potting type material.

A further purpose of the blivit $14B_{x,y,z}$ is to provide clearance for the sense/inhibit line 7 during threading so that the insulation on that winding 7 is not scraped off during threading by contact with the odd and even carrier planes 10, 15.

FIG. 7 illustrates the path of an X drive line 8 through the array 16. FIG. 8 illustrates the path of the Y drive line 9 through the array 16. The apertures $13A_{x,y,z}$ are of a diamter which is greater than the inside diameter of the memory core 11. This helps to prevent the insulation from scraping off on the X and Y drive lines 8, 9 during theading of the array. These windings are pulled against the rounded less abrasive edge of the core 11 rather than the sharp cutting edge of the odd and even carrier planes 10, 15.

Figure 9:
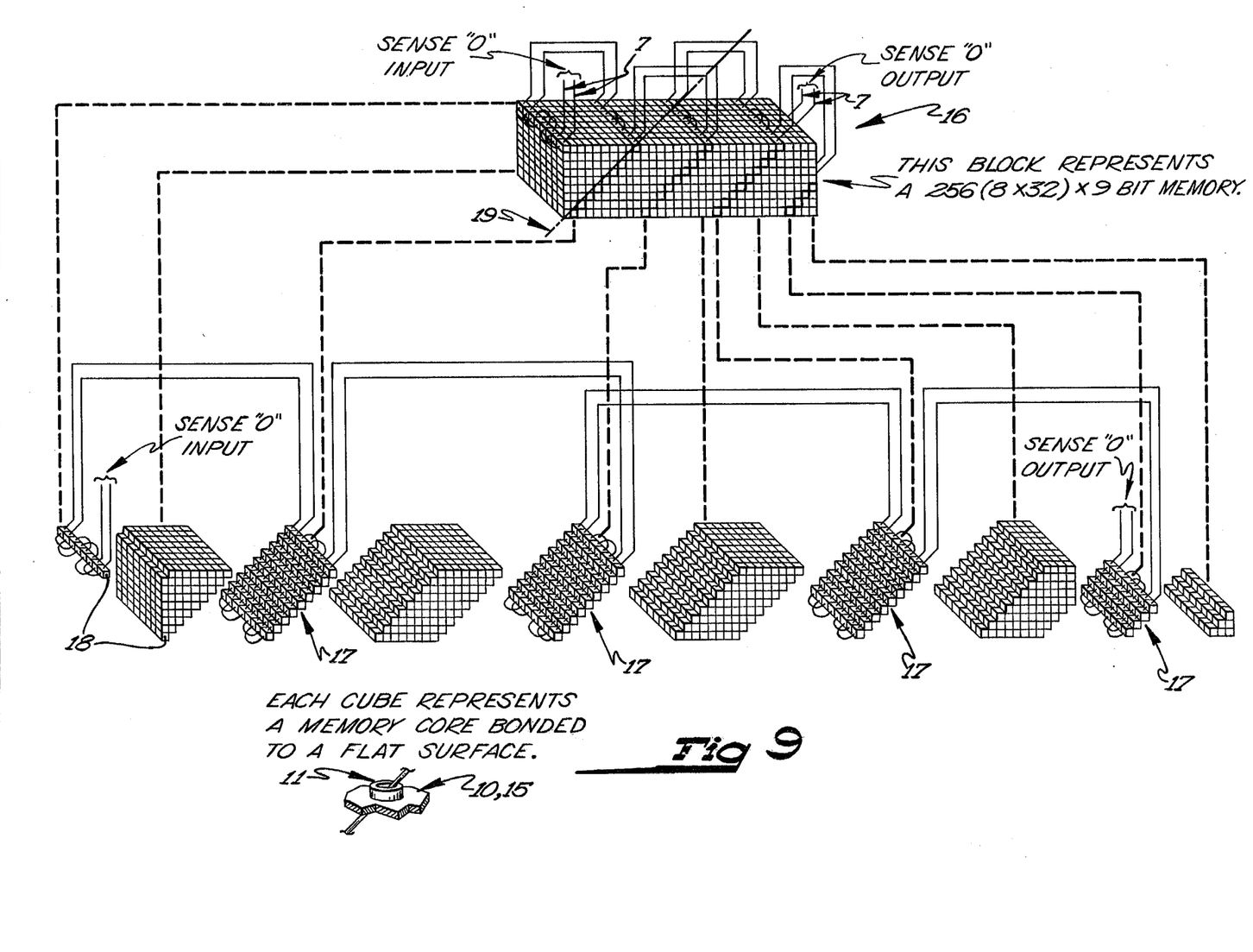

The electrical and geometric definition of a word or group of binary digits throughout an array 16 of the present invention is the same as in a stacked or a planar array. However, any designated bit location in the words of memory contained in the array 16 is defined by a diagonal line 19 through the array 16, as illustrated in FIG. 9. FIG. 9 illustrates various diagonal slices 17 through an array 16. The array is schematically illustrated in FIG. 9 by a stack of building block type cubes 18. Each cube 18 represents a core 11 on a segment of a carrier plane 10,15 as illustrated by the core details of FIG. 9. Each diagonal slice 17 represents a plurality of separate binary bits of the same respective location in various words of memory as illustrated in FIG. 9.

The routes of two typical sense/inhibit lines are schematically shown in FIG. 9 by line 7.

FIGS. 9 through 14 are schematic drawings of a typical cubic magnetic core storage memory system of the present invention.

Figure 10:
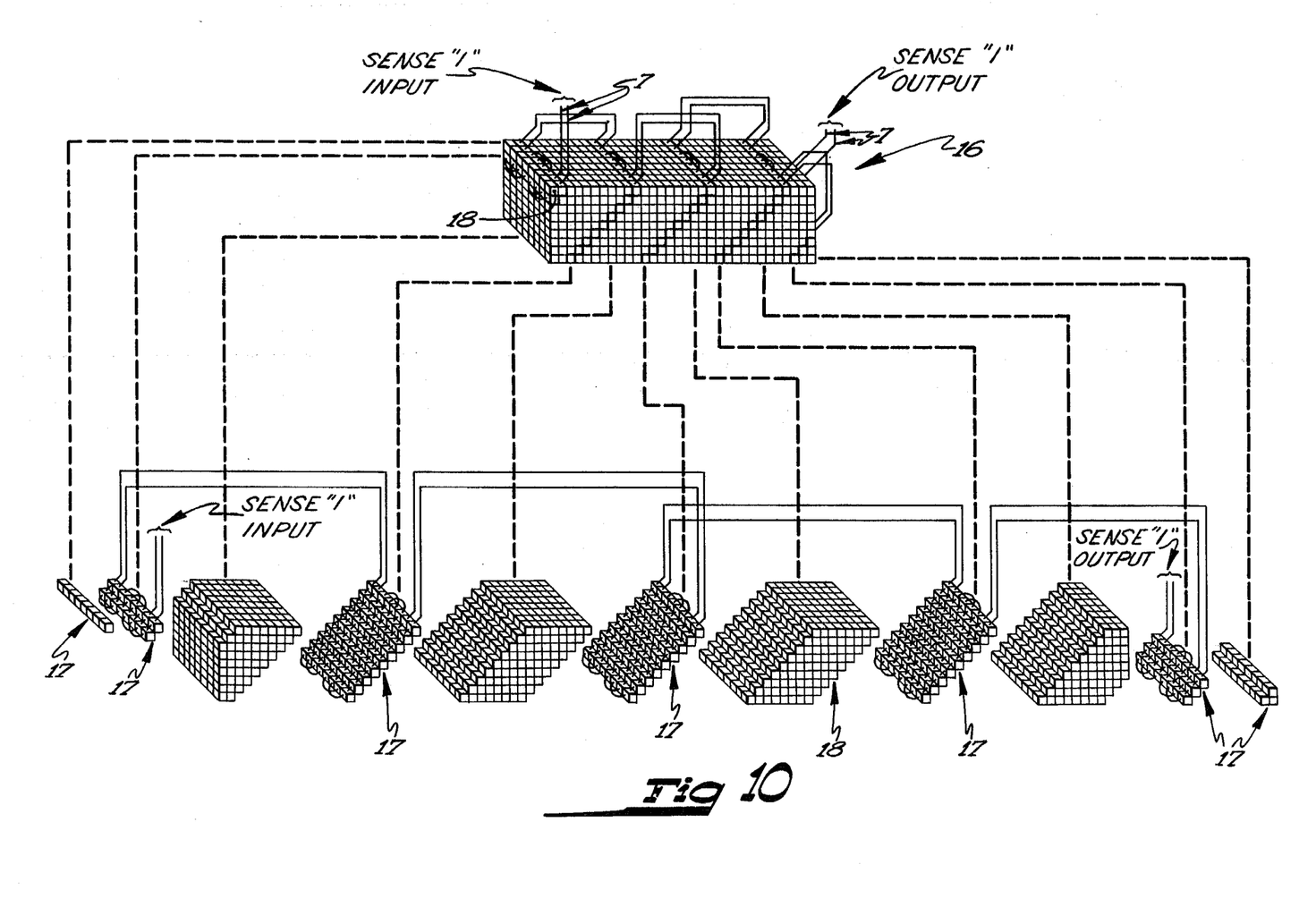

FIG. 10, like FIG. 9, presents the routing of a sense/inhibit line 7 through the array 16. It, however, presents a sense/inhibit line 7 which commences and terminates in a different slice 17 than that illustrated in FIG. 9. In like manner, each slice 17 of the array 16 will be threaded with a sense/inhibit line as illustrated in FIGS. 9 and 10.

Figure 11:
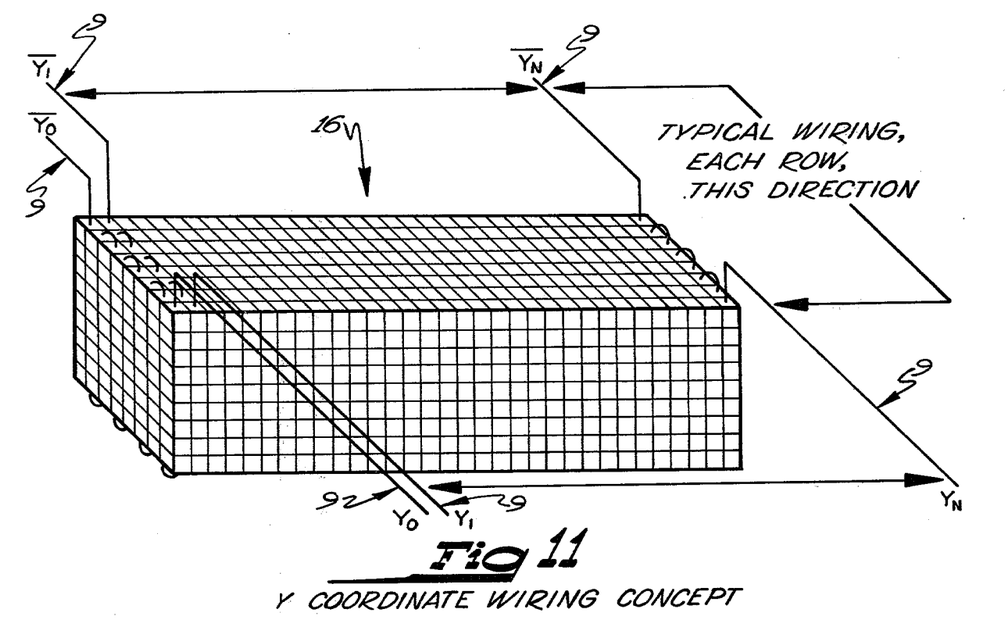

FIG. 11 schematically illustrates the Y coordinate wiring concept.

Figure 12:
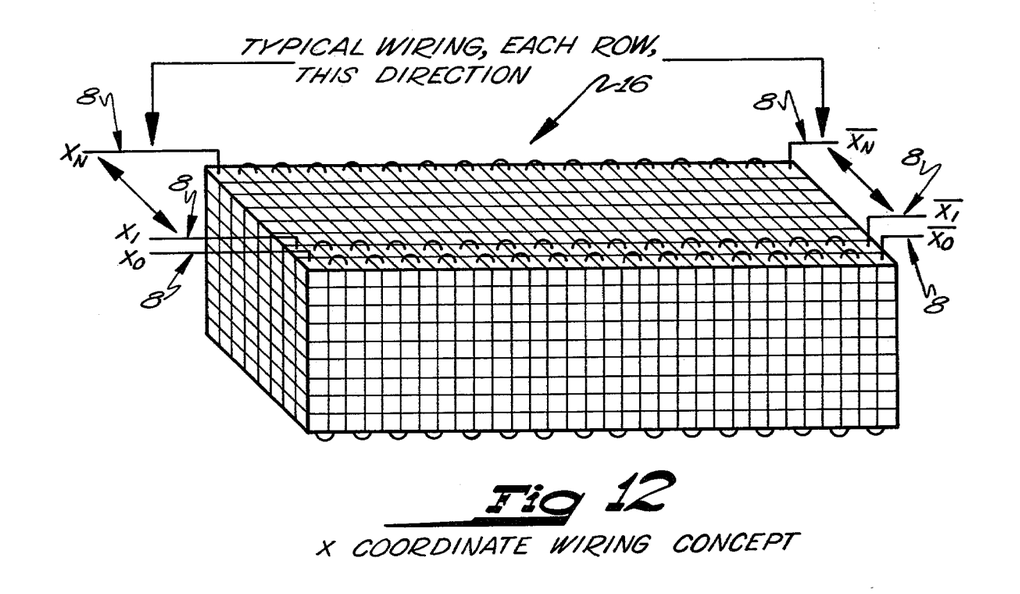

FIG. 12 schematically illustrates the X coordinate wiring concept.

FIG. 13 in conjunction with FIG. 14 depicts various memory system configuration possibilities of the present invention.

Figure 15:
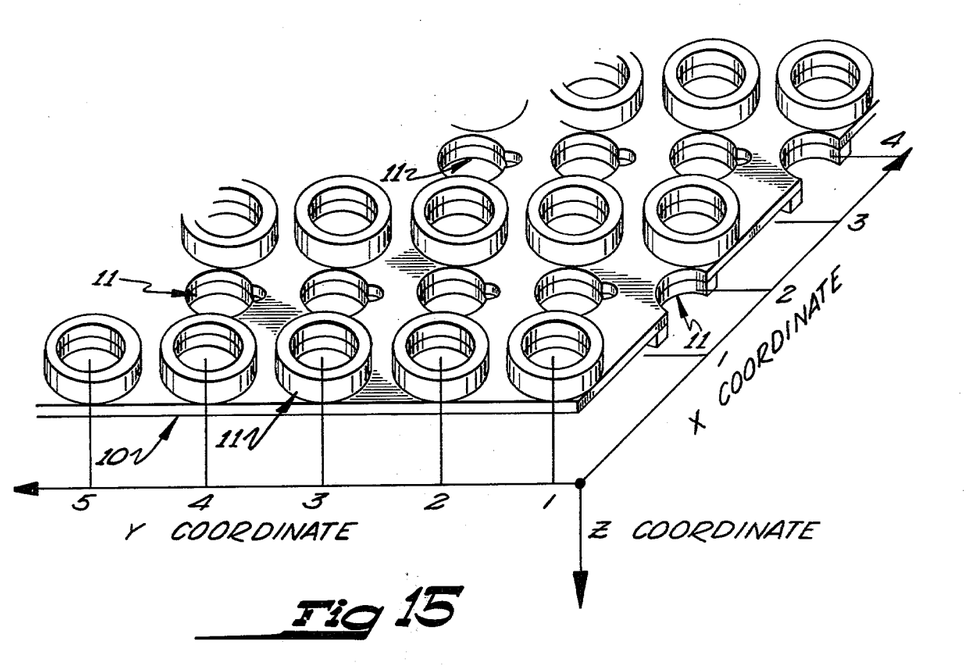

Although the preferred embodiment uses odd and even carrier planes 10,15, cores may be placed on odd or even carrier planes so that only odd carrier planes 10 or even carrier planes 15 need be used. For example, cores may be placed on odd carrier planes as described for the preferred embodiment. Additional cores may then be placed on the side of the odd carrier plane which is opposite to the side which has the cores as shown in FIG. 15 affixed to it in the preferred embodiment. These cores would be placed in substantial alignment with the axis of the apertures in the rows of apertures which do not have cores affixed to them in the preferred embodiment. The resultant core plane would, therefore, have a core affixed around the periphery of every aperture in the core plane. One-half would be on one side of the core plane and the other one-half of the cores would be on the other side. The core planes could be stacked and wired as described for the preferred embodiment to allow for an increased word size. In a like manner, all even planes could be used to make an array.

The advantages of the present invention over the existing technology are manifold. The placement of the cores 11 flat to the core carrier surface reduces the damaging effects of loading cores penpendicular to the surface. The memory system of the present invention allows increased word lengths without redesign of the core plane by simply increasing the quantity of core planes for any module or array. Increased densities over planar techniques are achieved. The cubic core memory system described herein is of a geometry compatible to that of the integrated circuit packaging.

The stringing of the present invention is far more economical than with any other technique. One of the reasons for the increased economy is due to the fact that the cores are not placed at 40°-45° to the axis of the X drive line and Y drive line. Therefore, when stringing these lines the stringing needle has a larger target because it will see the full inside diameter of each core. This results in fewer instances where the needle hits the core rather than the core aperture.

What is claimed is:

1. A magnetic core storage memory system comprising:
   (a) an even carrier plane having aligned rows of first apertures with second apertures adjacent to the periphery of the first apertures and in communication therewith;
   (b) an odd carrier plane having aligned rows of first apertures the axis of which are spaced apart a distance equal to the spacing between the axis of the first apertures of the even carrier plane with second apertures adjacent to the periphery of the first aperture and in communication therewith, said second aperture being disposed in a direction opposite to the direction of the second aperture of the even carrier plane, the odd carrier plane being placed relative to the even carrier plane so that the axis of the first apertures of the even carrier plane are coincident with the axis of the first apertures of the odd carrier plane;
   (c) a plurality of magnetic cores mounted on every other row of first apertures of an even carrier plane and a plurality of magnetic cores mounted on rows of first apertures on the odd carrier plane which rows correspond with the rows of the first apertures on the even carrier plane which rows have no magnetic cores mounted thereon;
   (d) a plurality of conductors threading the magnetic cores diagonal to the axis of each core; and
   (e) a plurality of conductors threading the magnetic cores parallel to the axis of each core.

2. The magnetic core storage memory system of claim 1, wherein every other row of apertures has magnetic cores mounted on one side of the carrier plane with the axis of the aperture substantially parallel to the axis of the magnetic core with which it is associated and each of the remaining rows of apertures have magnetic cores mounted on the opposite side of the magnetic core plane with the axis of the magnetic core substantially parallel to its associated aperture.

3. A magnetic core storage memory system comprising:
   (a) a plurality of even carrier planes with first apertures and with second apertures adjacent to the periphery of the first apertures and in communication therewith;
   (b) a plurality of odd carrier planes having first apertures the axis of which are spaced apart a distance equal to the spacing between the axis of the first apertures of the even carrier plane with second apertures adjacent to the periphery of the first apertures and in communication therewith, said second apertures being disposed in a direction opposite to the direction of the second apertures of the even carrier plane so that the axis of the first apertures of the even carrier plane are parallel with the axis of the first apertures of the odd carrier plane;
   (c) a plurality of magnetic cores mounted on the carrier plane;
   (d) a plurality of conductors threading the magnetic cores diagonal to the stack of carrier planes; and
   (e) a plurality of conductors threading the magnetic cores parallel to the axis of each magnetic core.

4. The magnetic core storage memory system of claim 3, wherein the system comprises multiple layers of even carrier planes and multiple layers of odd carrier planes arranged in a stack of alternate layers of even carrier planes and odd carrier planes.

5. The magnetic core storage memory system of claim 3, wherein the second apertures extend outwardly from the periphery of the first apertures to such an extent that when a wire is threaded diagonally through a core and a first aperture of a carrier plane and then diagonally through successive cores and carrier planes the wire does not contact the carrier planes.

* * * * *